United States Patent
Abe et al.

(10) Patent No.: US 10,393,797 B2
(45) Date of Patent: Aug. 27, 2019

(54) INSPECTION METHOD OF LAMINATED BOARD, INSPECTION MODULE, AND PALLET

(71) Applicant: FUJITSU LIMITED, Kawasaki-shi, Kanagawa (JP)

(72) Inventors: Mitsunori Abe, Kawasaki (JP); Takahiro Kitagawa, Kawasaki (JP); Shigeo Iriguchi, Kawasaki (JP); Kiyoyuki Hatanaka, Kawasaki (JP); Shigeru Sugino, Edogawa (JP); Ryo Kanai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 11 days.

(21) Appl. No.: 15/623,413

(22) Filed: Jun. 15, 2017

(65) Prior Publication Data
US 2018/0059170 A1    Mar. 1, 2018

(30) Foreign Application Priority Data
Sep. 1, 2016    (JP) .................... 2016-170957

(51) Int. Cl.
*G01R 31/28* (2006.01)

(52) U.S. Cl.
CPC ..... *G01R 31/2818* (2013.01); *G01R 31/2812* (2013.01); *G01R 31/2817* (2013.01)

(58) Field of Classification Search
CPC .............. G01R 1/2818; G01R 1/07335; G01R 31/2812; G01R 31/31717; G01R 31/31723; H01L 21/50; H01L 2924/15153; H01L 2924/1517; H05K 1/186; H05K 3/4069; H05K 3/4614; Y10T 156/1057
See application file for complete search history.

(56) References Cited

U.S. PATENT DOCUMENTS

| | | | | |
|---|---|---|---|---|
| 6,140,906 A * | 10/2000 | Kaihara | ............. | G01K 7/183 29/610.1 |
| 2005/0117312 A1* | 6/2005 | Kimura | ............. | H05K 1/186 361/746 |
| 2006/0043991 A1* | 3/2006 | Shimoda | ............. | G01R 1/07335 324/755.09 |
| 2010/0043712 A1* | 2/2010 | Tobe | ............. | C23C 14/12 118/728 |
| 2012/0306527 A1* | 12/2012 | O'Toole | ............. | G01R 31/2635 324/762.07 |
| 2014/0091819 A1* | 4/2014 | Gong | ............. | G01R 31/31926 324/750.3 |

FOREIGN PATENT DOCUMENTS

JP    2000-292474    10/2000

* cited by examiner

*Primary Examiner* — Akm Zakaria
(74) *Attorney, Agent, or Firm* — Xsensus LLP

(57) ABSTRACT

A method for inspecting a laminated board, includes: performing a reflow process to solder an electronic component to a surface of a laminated board in which at least one of a plurality of wiring layers which are laminated with each other is coupled to another adjacent wiring layer via a via; and inspecting, in the reflow process, a conduction state of the via after a temperature of the laminated board reaches a melting point of a solder, and when the temperature of the laminated board is at a temperature range lower than the melting point and higher than room temperature.

12 Claims, 13 Drawing Sheets

INSPECTION METHOD OF LAMINATED BOARD, INSPECTION MODULE, AND PALLET

CROSS-REFERENCE TO RELATED APPLICATION

This application is based upon and claims the benefit of priority of the prior Japanese Patent Application No. 2016-170957, filed on Sep. 1, 2016, the entire contents of which are incorporated herein by reference.

FIELD

The embodiments discussed herein are related to a method of inspecting a laminated board, an inspection module, and a pallet.

BACKGROUND

An inspection of a laminated board having a plurality of wiring layers is performed. For example, a printed wiring board is inspected in a state in which the printed wiring board is heated to a temperature near the rated temperature of the base material.

Related technologies are disclosed in, for example, Japanese Laid-Open Patent Publication No. 2000-292474.

SUMMARY

According to one aspect of the embodiments, a method for inspecting a laminated board, includes: performing a reflow process to solder an electronic component to a surface of a laminated board in which at least one of a plurality of wiring layers which are laminated with each other is coupled to another adjacent wiring layer via a via; and inspecting, in the reflow process, a conduction state of the via after a temperature of the laminated board reaches a melting point of a solder, and when the temperature of the laminated board is at a temperature range lower than the melting point and higher than room temperature.

The object and advantages of the disclosure will be realized and attained by means of the elements and combinations particularly pointed out in the claims. It is to be understood that both the foregoing general description and the following detailed description are exemplary and explanatory and are not restrictive of the disclosure, as claimed.

DESCRIPTION OF EMBODIMENTS

For example, the printed wiring board is inspected in a state in which the printed wiring board is heated to a temperature near the rated temperature of the base material.

A build-up board, which is one of laminated boards, is manufactured by stacking a plurality of wiring layers one by one and repeating punching, wiring formation, and the like. In the build-up board, since a high-density wiring is realized, a stack via structure for stacking vias in respective wiring layers is adopted.

Figure 1A:
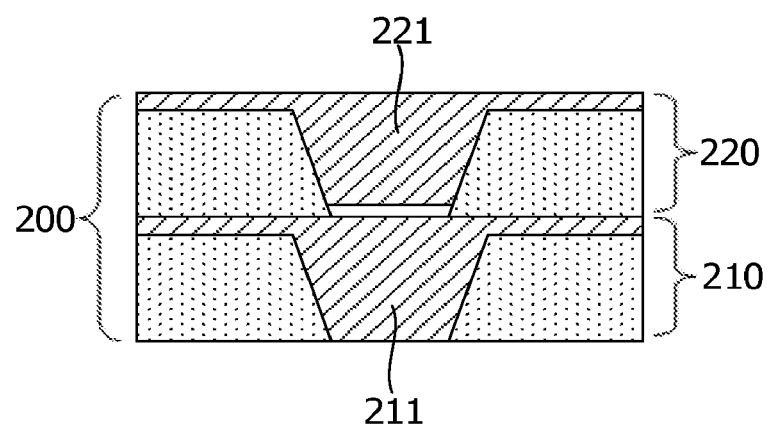
FIGS. 1A and 1B illustrate a partial cross-sectional view of an exemplary build-up board.
Figure 1B:
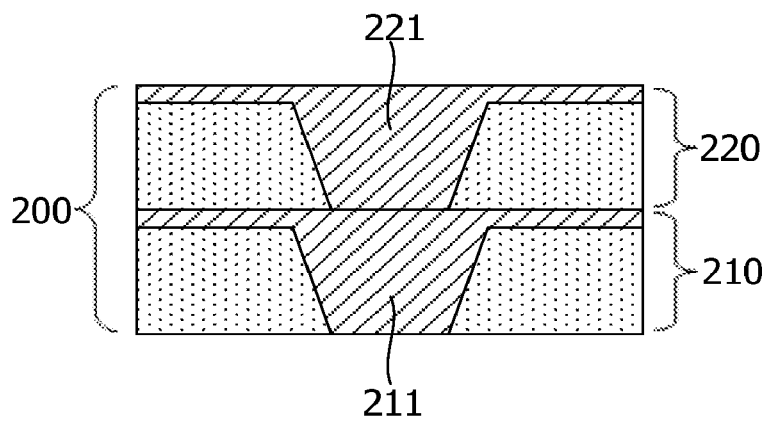

FIGS. 1A and 1B illustrate a partial cross-sectional view of an exemplary build-up board. In FIGS. 1A and 1B, a partial cross-sectional view of a build-up board including a build-up layer 200 formed by stacking wiring layers 210 and 220 is illustrated. In the build-up board, since the wiring layers 210 and 220 are stacked one by one, the process of forming the via 211 and the process of forming the via 221 are separate processes from each other. Therefore, the bonding strength between the via 211 and the via 221 may be weakened due to mixing of foreign matters between the via 211 and the via 221, oxidation of the bonding surfaces between the via 211 and the via 221, or the like. In this case, for example, as illustrated in FIG. 1A, a disconnection in which the via 211 and the via 221 are separated from each other may occur due to the thermal stress in the reflow process for soldering an electronic component to the surface of the build-up board.

For example, in the case where the disconnected surfaces of the via 211 and the via 221 are flat, when the build-up board returns to room temperature, as illustrated in FIG. 1B, there is a case where the disconnected via 211 and via 221 come into contact with each other to be conductive. In this case, it is difficult to detect a disconnection between vias by inspection conducted at room temperature, and the laminated board may leak out to the market as a good product. For example, when a server or the like on which this laminated board is mounted is operated at a customer after the laminated board is shipped, the temperature of the laminated board rises, and the vias may be disconnected again.

For example, in order to determine the laminated board described above as a defective product, inspection may be performed in a state in which the build-up board is heated. In this case, expensive inspection equipment including a heating mechanism for heating the build-up board is used.

For example, a method of detecting a disconnection between vias in a laminated board at a lower cost may be provided.

In each drawing, the same reference numerals are given to identical or equivalent components and portions.

Figure 2:
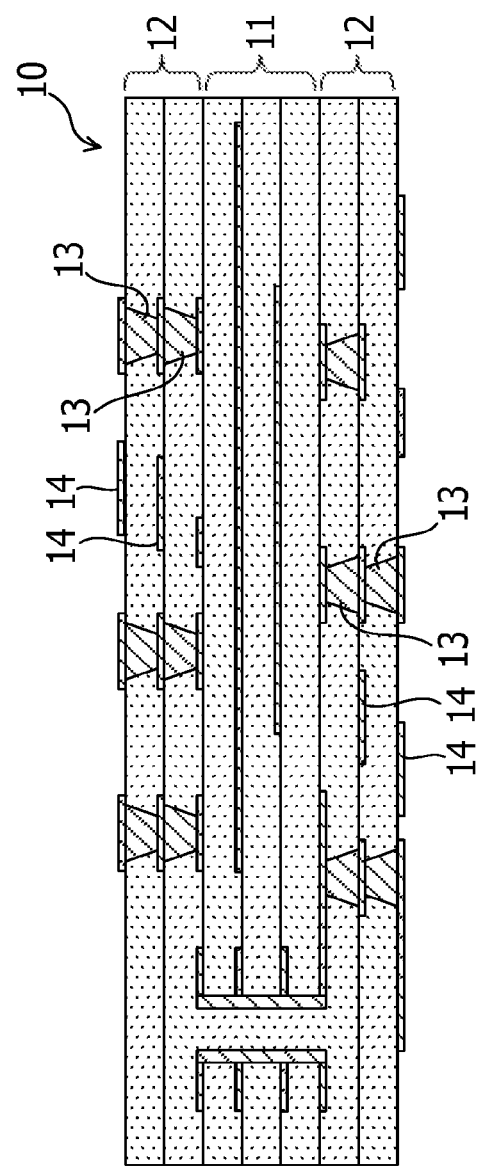
FIG. 2 illustrates a cross-sectional view of an exemplary laminated board to be inspected.

FIG. 2 illustrates a cross-sectional view of an exemplary laminated board to be inspected. In FIG. 2, a cross-sectional view of the configuration of the laminated board 10 to be inspected by a specific inspection method is illustrated. The laminated board 10 may be a build-up board including a core layer 11 and build-up layers 12 provided on both surfaces of the core layer 11, respectively. Each of the core layer 11 and the build-up layers 12 is formed by stacking a plurality of wiring layers each provided with a wiring 14. The build-up layers 12 are laminated by stacking wiring layers one by one and repeating punching, wiring formation, and the like. The build-up layer 12 has a stack via structure in which vias 13 are stacked between adjacent wiring layers.

Figure 3:
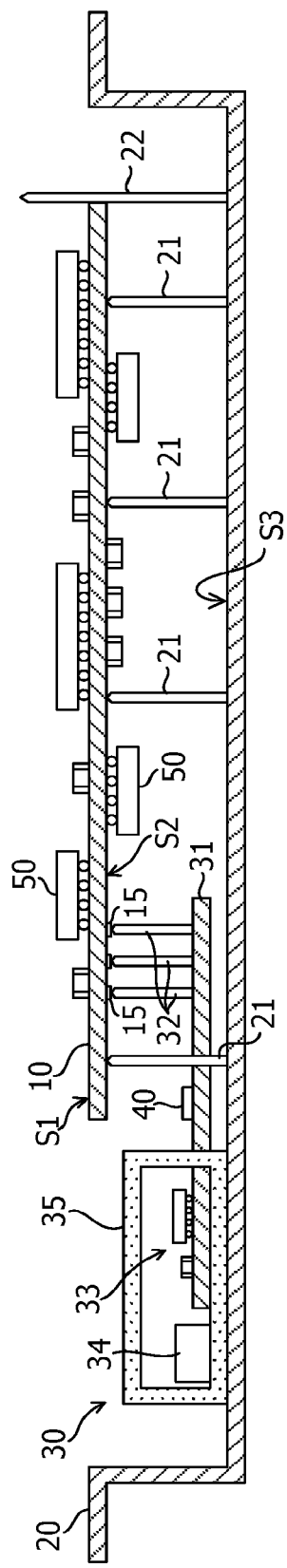
FIG. 3 illustrates an exemplary inspection method.

FIG. 3 illustrates an exemplary inspection method. In FIG. 3, an exemplary inspection method for inspecting the conduction state between the vias 13 in the laminated board 10 is illustrated. Electronic components 50 are mounted on a first surface S1 and a second surface S2 of the laminated board 10. The reflow process for soldering the electronic components 50 to the first surface S1 and the reflow process for soldering the electronic components 50 to the second surface S2 may be separately performed. In this case, the inspection of the laminated board 10 is performed during the reflow process to be performed later. For example, in a case where the reflow process for bonding the electronic components 50 to the first surface S1 is performed after the reflow process for bonding the electronic components 50 to the second surface S2, the inspection of the laminated board 10 is performed during the reflow process for soldering the electronic components 50 to the first surface S1.

The inspection of the laminated board 10 during the reflow process is performed using a pallet 20 illustrated in FIG. 3. The pallet 20 has a plurality of support pins 21 attached to the bottom surface S3 thereof and a plurality of positioning pins 22 attached to the bottom surface S3 thereof. Each of the supports pins 21 comes into contact with the second surface S2 of the laminated board 10 to support the laminated board 10. By supporting the laminated board 10 with the support pins 21, a space is formed between the second surface S2 of the laminated board 10 and the bottom surface S3 of the pallet 20. The positioning pins 22 are used to determine the mounting position of the laminated board 10 in the pallet 20. For example, by placing the laminated board 10 so that the end portion of the laminated board 10 is in contact with the side surface of the positioning pins 22, the mounting position of the laminated board 10 in the pallet 20 is determined.

On the pallet 20, an inspection module 30 is installed to inspect the laminated board 10. The inspection module 30 includes an inspection unit 33, an inspection pin 32, a temperature sensor 40, and a battery 34. The inspection unit 33, the inspection pin 32, and the temperature sensor 40 are provided on, for example, the same wiring board 31. The inspection unit 33 and the inspection pin 32, and the inspection unit 33 and the temperature sensor 40 are electrically connected to each other by wires provided on the wiring board 31. Since the inspection unit 33 and the battery 34 are surrounded by a heat insulating member 35, conduction to the inspection unit 33 and the battery 34 of heat given to the laminated board 10 during the reflow process is reduced.

The inspection unit 33 includes a memory that stores an inspection program for inspecting the conduction state of vias of the laminated board 10, a processor that executes the inspection program, a memory that stores test data acquired by inspection, and a peripheral circuit. The battery 34 supplies electric power required for the inspection unit 33 to inspect the laminated board 10 to the inspection unit 33.

The temperature sensor 40 detects the ambient temperature and supplies a temperature measurement signal indicating the detected temperature to the inspection unit 33. The temperature detected by the temperature sensor 40 may be substantially equal to the temperature of the laminated board 10 during the reflow process. The inspection unit 33 starts executing the inspection program based on a temperature measurement signal supplied from the temperature sensor 40.

The wiring board 31 has a portion protruding in a space formed between the second surface S2 of the laminated board 10 supported by the support pins 21 and the bottom surface S3 of the pallet 20. The inspection pin 32 is provided on the protruding portion of the wiring board 31. The inspection pin 32 is brought into contact with an inspection pad 15 formed on the second surface S2 of the laminated board 10. Therefore, the inspection unit 33 and the laminated board 10 are electrically coupled, and the laminated board 10 is inspected by the inspection unit 33.

Figure 4:
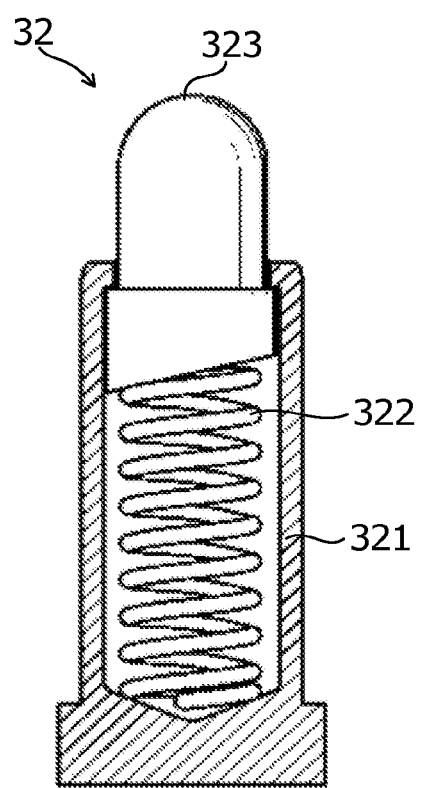
FIG. 4 illustrates an exemplary inspection pin used for an inspection method.

FIG. 4 illustrates an exemplary inspection pin used for an inspection method. In FIG. 4, an exemplary internal structure of the inspection pin 32 is illustrated. The inspection pin 32 includes a tube 321, a spring 322, and a pin 323. The pin 323 to be brought into contact with the inspection pad 15 of the laminated board 10 is provided so as to be slidable along the internal wall of the tube 321. The spring 322 is housed inside of the tube 321. When the tip of the pin 323 adjoins the inspection pad 15 of the laminated board 10, a pressing force acts on the pin 323 in the direction of the laminated board 10. The relative positional relationship between the inspection pin 32 and the inspection pad 15 may be matched by positioning the laminated board 10 with the positioning pin 22.

Figure 5:
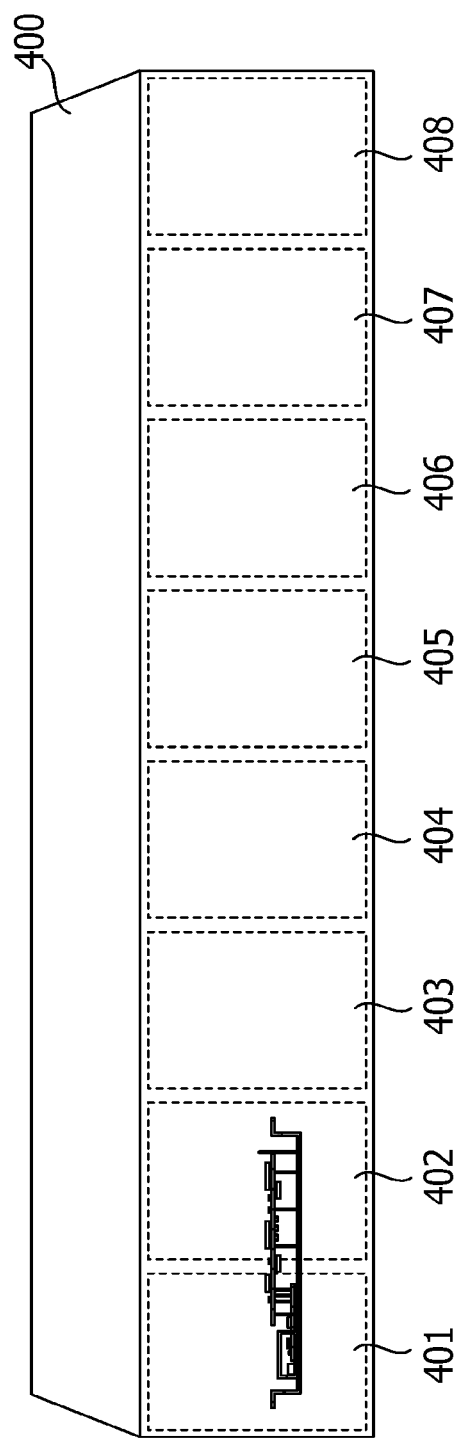
FIG. 5 illustrates an exemplary reflow furnace.

FIG. 5 illustrates an exemplary reflow furnace. For example, the reflow process for soldering the electronic component 50 to the laminated board 10 may be performed using the reflow furnace 400 illustrated in FIG. 5. In the reflow furnace 400, a plurality of heating units 401 to 408 having different set temperatures with each other are coupled in series. In the reflow process, the laminated board 10 moves in the reflow furnace 400 in a state of being mounted on the pallet 20. The pallet 20 on which the laminated board 10 is mounted is placed on a rail including a metal chain provided inside the reflow furnace 400 so that the pallet 20 is conveyed from a first-stage heating unit 401 to a final-stage heating unit 408. By sequentially passing through the heating units 401 to 408, the laminated board 10 is subjected to a heat treatment by a temperature profile formed according to the set temperature of each of the heating units 401 to 408, and the soldering of the electronic component 50 is completed.

Figure 6:
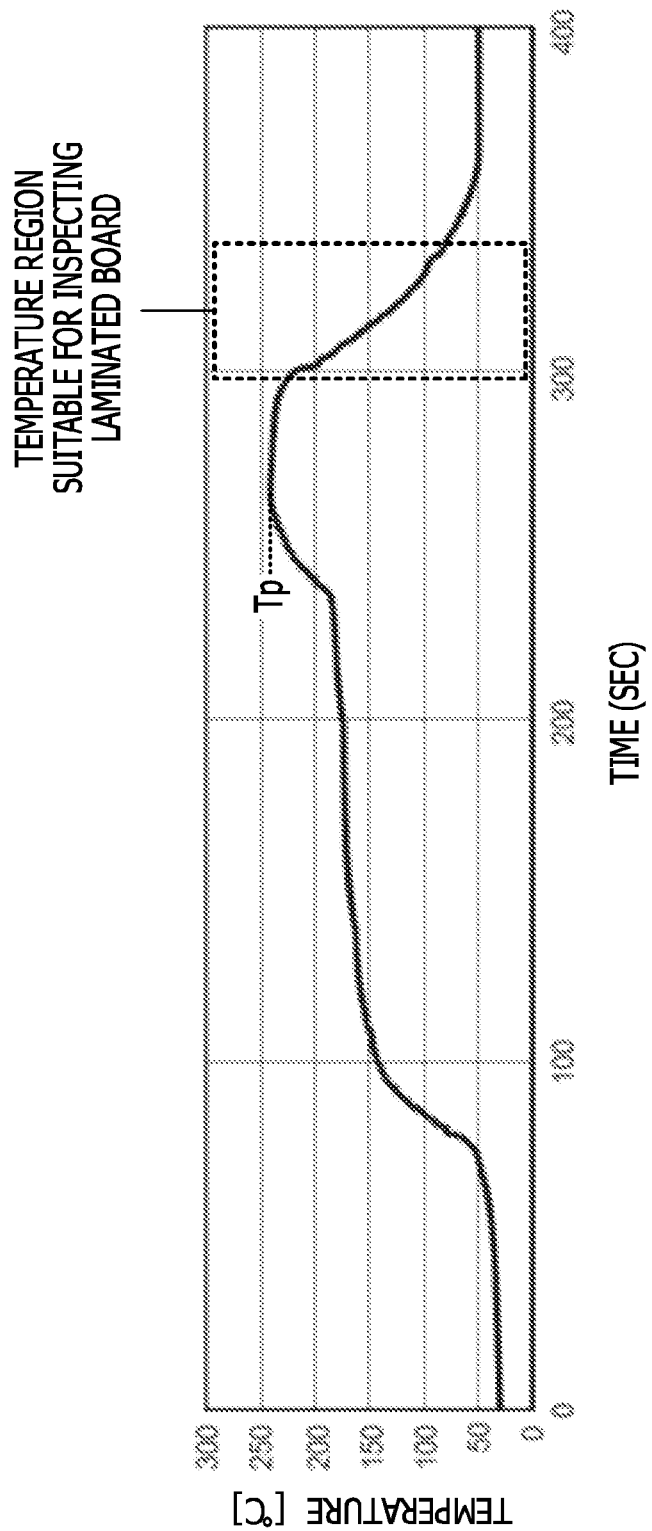
FIG. 6 illustrates an exemplary temperature profile formed in a reflow furnace.

FIG. 6 illustrates an exemplary temperature profile formed in a reflow furnace. In FIG. 6, a graph of a temperature profile formed according to the set temperature of each of the heating units 401 to 408 is illustrated. The horizontal axis represents the elapsed time from the time when the laminated board 10 is put into the reflow furnace 400. The vertical axis represents the temperature of the laminated board 10 during the reflow process. By the heating units 401 to 408, a temperature profile is formed in which the temperature gradually rises from room temperature toward the peak temperature Tp slightly higher than the melting temperature of the solder and the temperature gradually decreases after reaching the peak temperature Tp.

The inspection of the laminated board 10 may be performed in a process in which the temperature of the laminated board 10 decreases from the peak temperature Tp. For example, the laminated board 10 may be inspected at a temperature range lower than the melting temperature of the solder and higher than room temperature (25° C.). For example, when the melting temperature (melting point) of the solder is 230° C., the inspection of the laminated board 10 may be performed at a temperature range of 80° C. to 220° C. In FIG. 6, a region surrounded by a broken line illustrates a temperature region (timing) suitable for performing the inspection of the laminated board 10.

Figure 7:
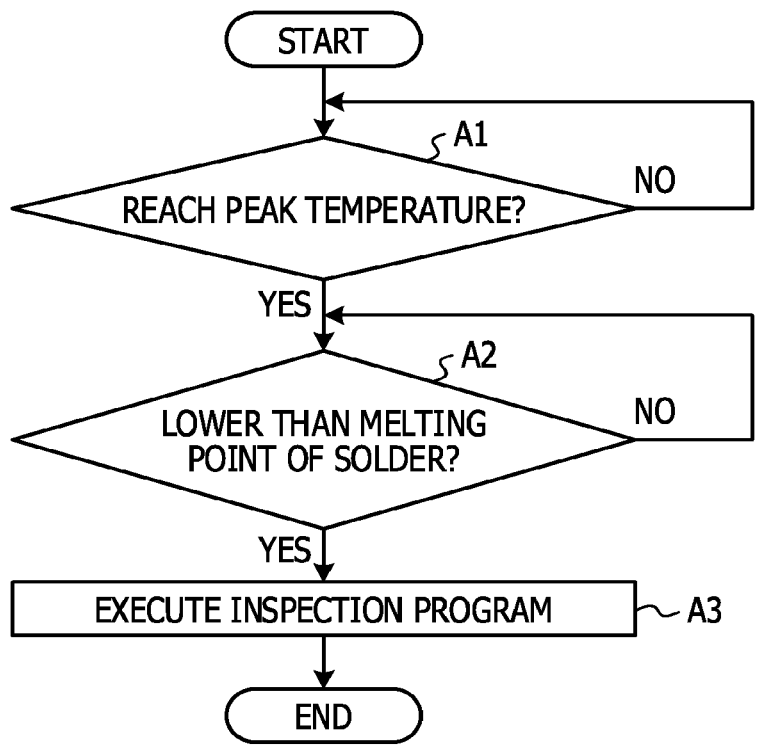
FIG. 7 illustrates an exemplary processing of an inspection unit.

By starting the execution of the inspection program based on the temperature measurement signal supplied from the temperature sensor 40, the inspection unit 33 performs the inspection at the temperature range lower than the melting temperature of the solder and higher than room temperature. FIG. 7 illustrates an exemplary processing of an inspection unit. In FIG. 7, a processing made by the inspection unit 33 is illustrated.

In operation A1, the inspection unit 33 determines whether or not the temperature indicated by the temperature measurement signal supplied from the temperature sensor 40 reaches the peak temperature Tp of the temperature profile in the reflow furnace 400. When the temperature indicated by the temperature measurement signal reaches the peak temperature, it is ensured that the solder has been molten. When the inspection unit 33 determines that the temperature indicated by the temperature measurement signal reaches the peak temperature Tp, the process proceeds to operation A2.

In operation A2, the inspection unit 33 determines whether or not the temperature indicated by the temperature measurement signal supplied from the temperature sensor 40 decreases to a specific temperature lower than the melting temperature of the solder. When the inspection unit 33 determines that the temperature indicated by the temperature measurement signal decreases to the specific temperature lower than the melting temperature of the solder, the process proceeds to operation A3.

In operation A3, the inspection unit 33 starts inspecting the laminated board 10 by starting execution of the inspection program.

Based on the inspection program, the inspection unit 33 inspects the operation characteristics of a circuit formed by the vias 13 provided on the laminated board 10, the wirings 14, and the electronic components 50 mounted on the laminated board 10, whereby the conduction state of the vias 13 is inspected. For example, the conduction state of the vias may be inspected through the operation characteristics of the entire device including the laminated board 10 and the electronic components 50. The inspection data acquired by the inspection is stored in a memory provided in the inspection unit 33. The inspection data is read out from the memory after reflow processing of the laminated board 10. The inspection data acquired by the inspection unit 33 may be acquired in real time by wireless communication.

In the above inspection method, during the reflow process for solder bonding the electronic components 50 to the surface of the laminated board 10, the conduction state between the vias 13 provided on the laminated board 10 is inspected. A disconnection between the vias as illustrated in FIG. 1A occurs due to a difference in thermal expansion coefficient between the base material constituting the laminated board 10, for example, a glass epoxy resin, and the vias 13, for example, copper. Therefore, the disconnection between the vias 13 is more likely to occur as the temperature of the laminated board 10 becomes higher. By performing the inspection of the laminated board 10 during the reflow process, a disconnection between the vias 13 may be more reliably detected, as compared to the case where the inspection is performed at room temperature. For example, by performing the high-temperature inspection of the laminated board 10 during the reflow process, since the laminated board 10 is heated by using the heating unit provided in the reflow furnace 400, expensive inspection equipment having a heating mechanism may be unnecessary. For example, a disconnection between the vias 13 in a laminated board may be detected at a lower cost.

By inspecting the operation characteristics of a circuit including the vias 13 provided on the laminated board 10, the wirings 14, and the electronic components 50 mounted on the laminated board 10, the conduction state of the vias is inspected. For example, in the case where the inspection of the conduction state between the vias 13 is performed by the laminated board 10 alone, in order to inspect the conduction state of all the vias, an expensive inspection jig provided with many inspection pins may be used. In the meantime, in the inspection of the operation characteristics of a circuit including the vias 13, the wirings 14, and the electronic components 50, since a plurality of vias 13 are inserted into the circuit, the number of required inspection pins may be reduced. By inspecting the operation characteristics of a circuit including the vias 13, the wirings 14, and the electronic components 50, not only the conduction state between the vias 13, but also the function of the electronic components 50 and the state of the solder bonding between the electronic components 50 and the laminated board 10 may also be inspected.

In the above inspection method, the laminated board 10 is inspected at a temperature range lower than the melting point of the solder and higher than room temperature. By performing the inspection at a temperature lower than the melting temperature of the solder, since the solder is in a solid state, the inspection may be performed while the electrical connection between the electronic components 50 and the laminated board 10 is completed. By performing the inspection at a temperature higher than room temperature, a disconnection between the vias 13 may be more reliably detected, as compared to the inspection performed at room temperature.

Table 1 indicates a result of estimating the relationship between the size of a gap formed between the vias 13 in which a disconnection occurs and the temperature of the laminated board 10. For example, assuming that the thermal expansion coefficient of the base material (glass epoxy resin) of the laminated board 10 is 35 to 45 ppm/° C. and the thermal expansion coefficient of the via (copper) is 15 ppm/° C., the size of the gap between the vias 13 at 50° C., 80° C., and 100° C. is estimated.

TABLE 1

| | Temperature | | |
|---|---|---|---|
| | 50° C. | 80° C. | 100° C. |
| Size of Gap | 0.5 μm | 1.1 μm | 1.5 μm |

As indicated in Table 1, as the temperature of the laminated board 10 becomes higher, the size of the gap between the vias 13 becomes larger. In order to more reliably detect the disconnection between the vias 13, the size of the gap between the vias 13 may be 1 μm or more. Therefore, during the reflow process, the laminated board 10 may be inspected within a period in which the temperature of the laminated board 10 is maintained at 80° C. or higher.

In the above inspection method, the conduction state of the vias 13 is inspected by inspecting the operation characteristics of a circuit formed by the vias 13, the wirings 14, and the electronic components 50 mounted on the laminated board 10. For example, it may be difficult to secure a space for placing the inspection pads in a product portion where the electronic components 50 are mounted on the laminated board 10. In this case, a coupon for inspection may be provided on a key plate portion provided in the outer periphery of the product portion of the laminated board 10, and the coupon for inspection may be a target to be inspected.

Figure 8:
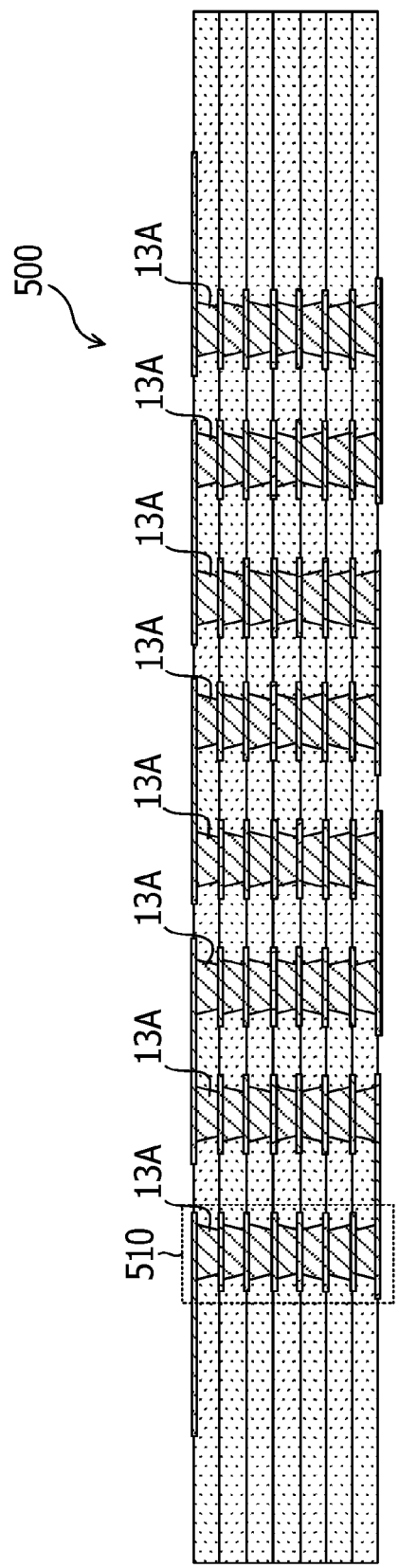
FIG. 8 illustrates an example of a cross-sectional view of a coupon for inspection.

FIG. 8 illustrates a cross-sectional view of an exemplary coupon for inspection. For example, in FIG. 8, a cross-sectional view of a coupon 500 for inspection provided on a key plate portion of the laminated board 10 is illustrated. The coupon 500 for inspection may include a daisy chain in which a plurality of full-layer stack via structures 510 are coupled in series. The full-layer stack via structure 510 may have a structure in which inspection vias 13A are stacked over all the wiring layers. The inspection vias 13A simulate the vias 13 provided in the product portion of the laminated board 10, and may be formed using the same process as the vias 13.

In the inspection using the coupon 500 for inspection, for example, by measuring the resistance value of the daisy chain, it is determined whether there is a disconnection between the inspection vias 13A. Based on the result, the conduction state of the vias 13 provided in the product portion of the laminated board 10 may be estimated. The inspection using the coupon 500 for inspection is performed during reflow processing for solder bonding the electronic components 50 to the laminated board 10. The diameter of the inspection via 13A provided in the coupon 500 for inspection may be made smaller than the diameter of the vias 13 provided in the product portion in order to facilitate disconnection between the vias. As a result, inspection with a margin may be performed on the vias 13 provided in the product portion of the laminated board 10.

Figure 9:
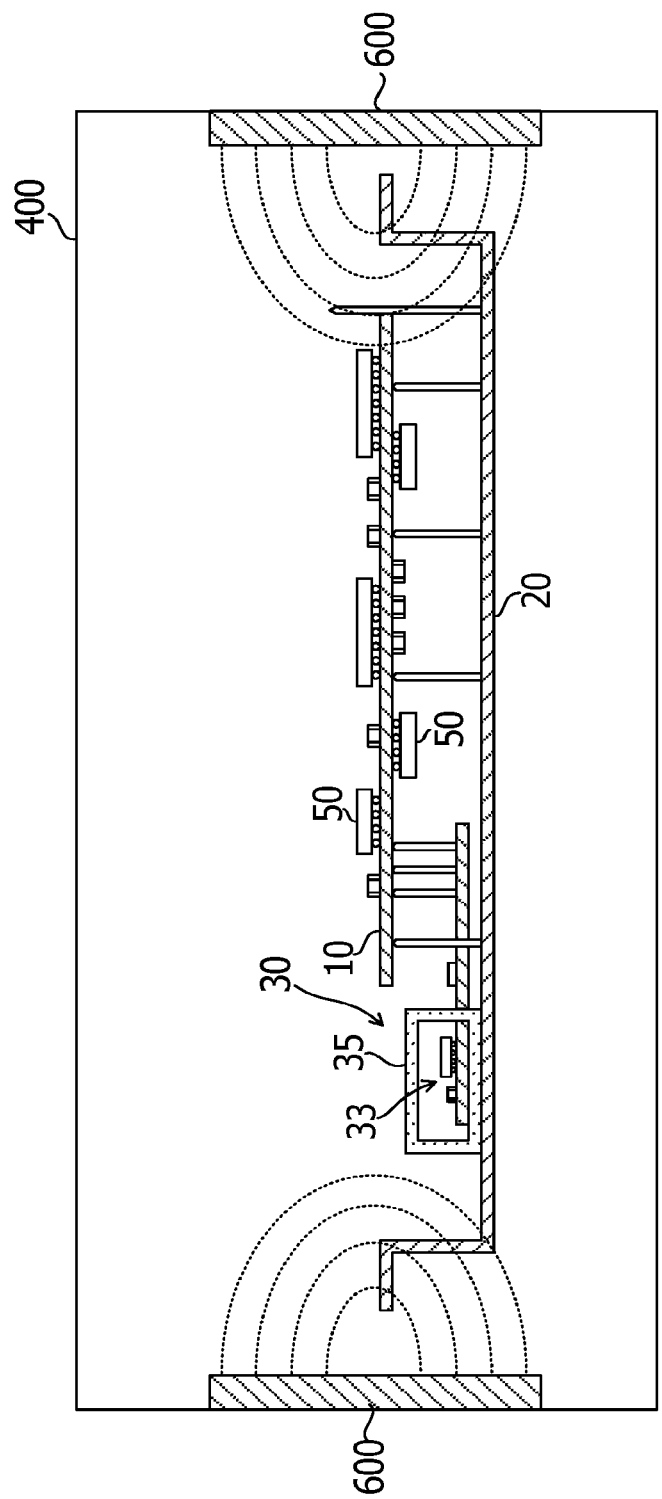
FIG. 9 illustrates an exemplary method for supplying power to an inspection unit.

The electric power required for the inspection unit 33 to inspect the laminated board 10 may be supplied from the battery 34, and the present disclosure is not limited to this mode. FIG. 9 illustrates an exemplary method for supplying power to an inspection unit. For example, as illustrated in FIG. 9, the inspection unit 33 may be operated by electric power supplied from a non-contact power supply device 600 installed inside the reflow furnace 400. Examples of the non-contact power supply method by the non-contact power supply device 600 include an electromagnetic induction method, a magnetic field resonance method, a radio wave transmission method, an electric field coupling method, and a DC resonance method.

Figure 10:
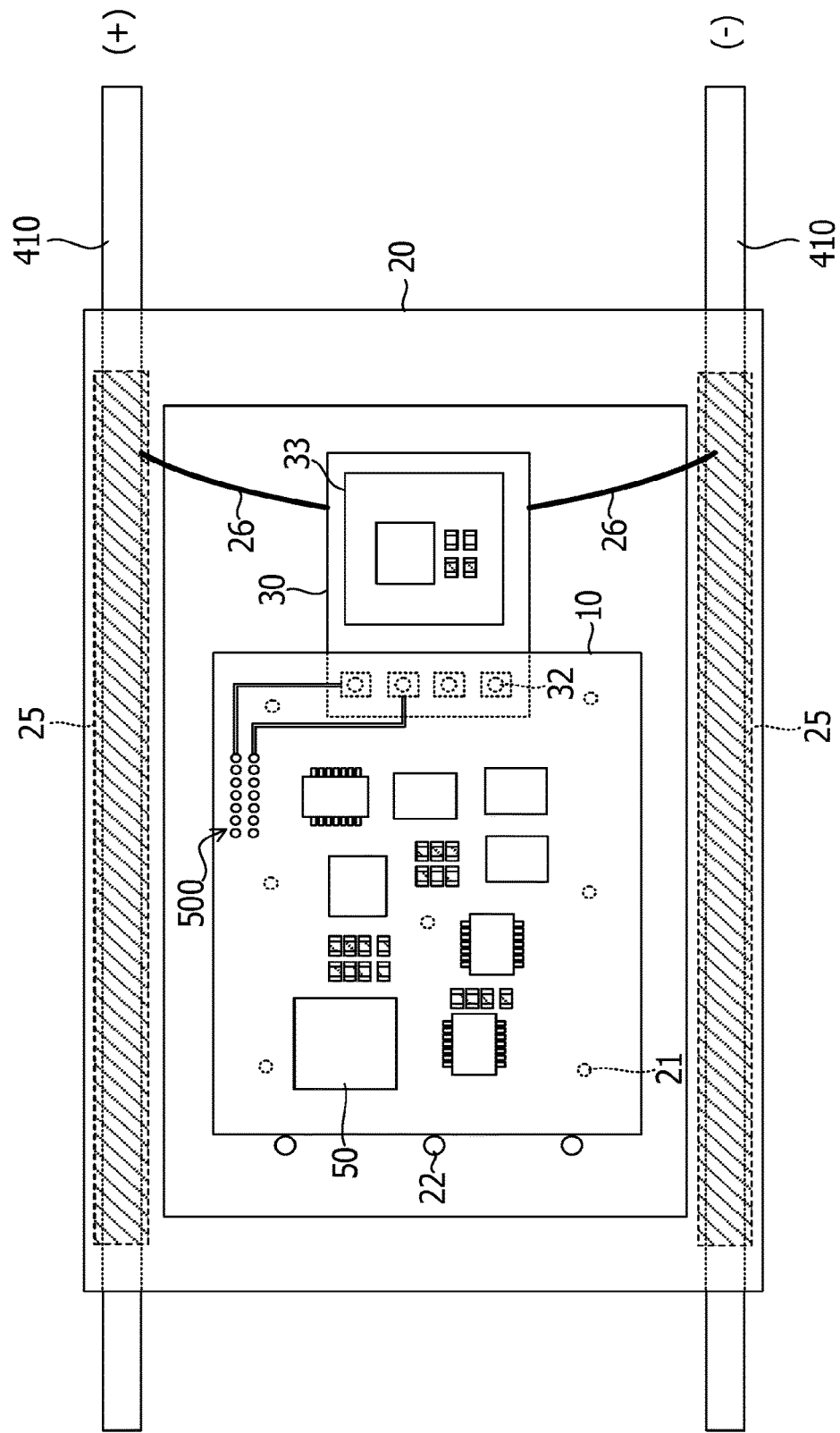
FIG. 10 illustrates an exemplary method for supplying power to an inspection unit.

FIG. 10 illustrates an exemplary method for supplying power to an inspection unit. For example, as illustrated in FIG. 10, the inspection unit 33 may be operated by electric power supplied from a pair of rails 410 provided in the reflow furnace as a conveying unit of the pallet 20 by using the pair of rails 410 as power supply lines. For example, one of the pair of rails 410 is used as the positive electrode of the power supply line, and the other of the pair of rails 410 is used as the negative electrode of the power supply line. Pads 25 for power supply are provided on the contact surface of the pallet 20 with the rails 410, and the inspection unit 33 and the pads 25 for power supply are coupled by a wiring 26. In FIG. 10, the laminated board 10 is inspected with the coupon 500 for inspection as the target.

Figure 11:
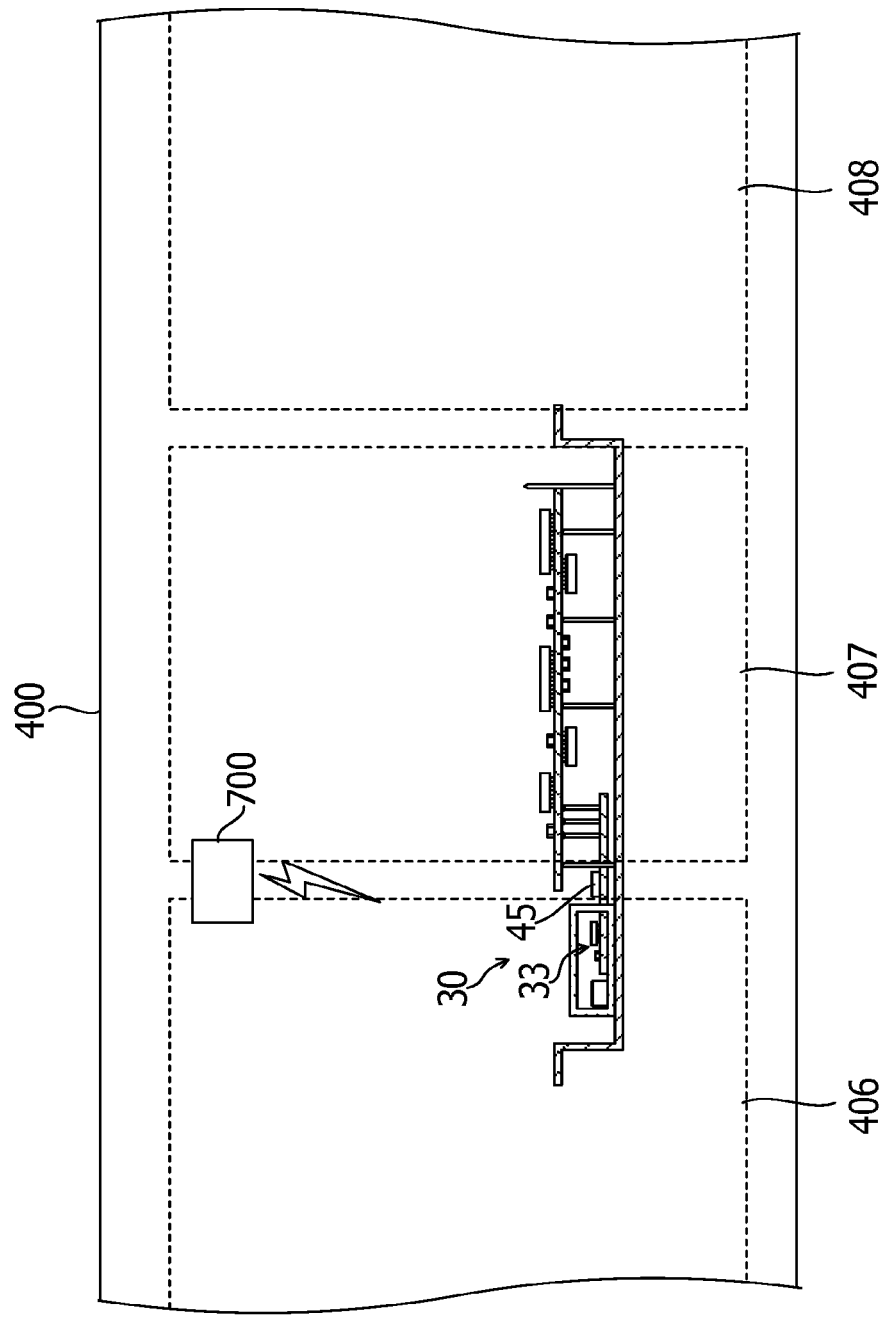
FIG. 11 illustrates an exemplary method for determining a start timing of an inspection program.

The timing at which the inspection unit 33 starts the execution of the inspection program may be determined based on the temperature measurement signal output from the temperature sensor 40, and the present disclosure is not limited to this mode. FIG. 11 illustrates an exemplary method for determining the start timing of an inspection program. For example, as illustrated in FIG. 11, when a signal transmitted from a transmitter 700 is received by a receiver 45 provided in the inspection module 30, execution of the inspection program may be started in the inspection unit 33. The transmitter 700 may transmit electromagnetic waves such as radio waves or infrared rays and may be provided in a zone where execution of the inspection program in the reflow furnace 400 is to be started. The receiver 45 receives electromagnetic waves transmitted from the transmitter 700 when approaching the transmitter 700. The receiver 45 may be provided instead of the temperature sensor 40 in the inspection module 30.

Figure 12:
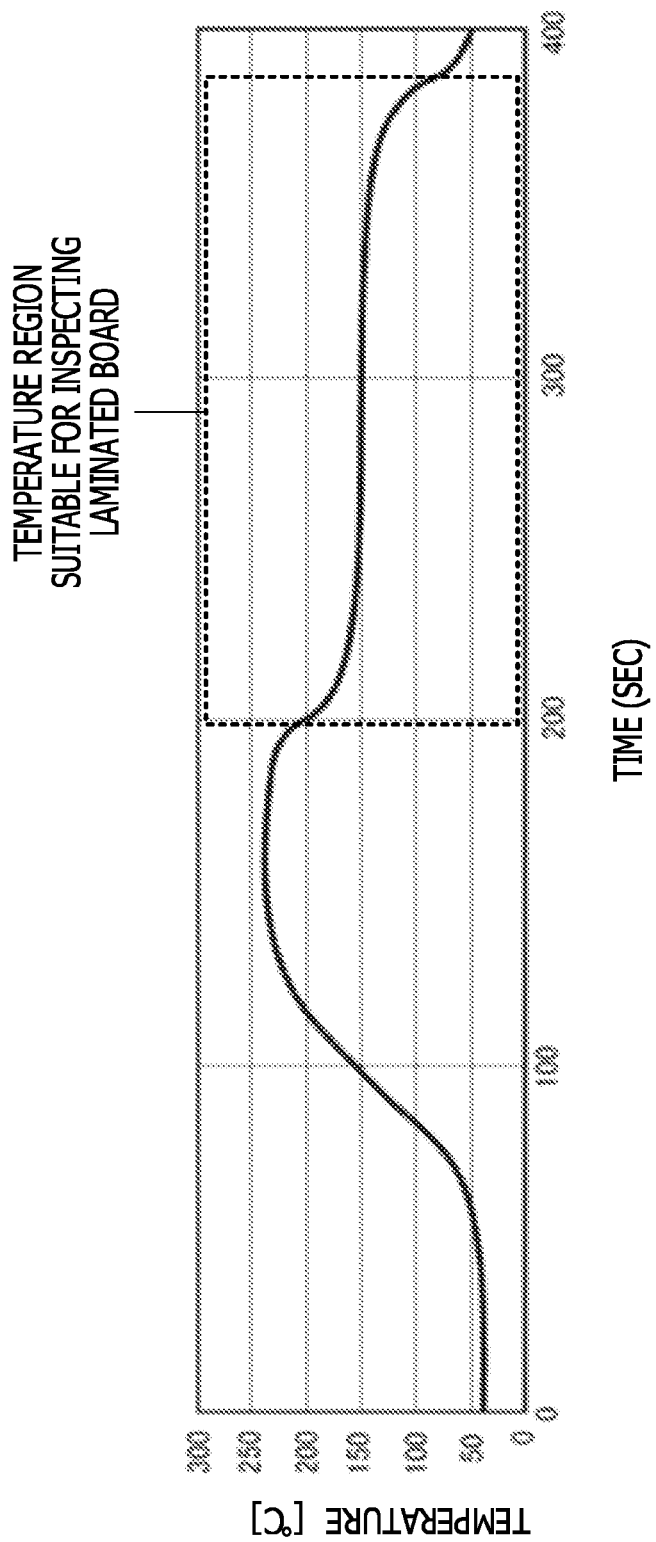
FIG. 12 illustrates an exemplary temperature profile formed in a reflow furnace.

The temperature profile illustrated in FIG. 6 may be properly modified. FIG. 12 illustrates an exemplary temperature profile formed in a reflow furnace. For example, as illustrated in FIG. 12, by lengthening the distance in the temperature region which is lower than the melting point of the solder and higher than room temperature, as compared to the temperature profile illustrated in FIG. 6, a time period suitable for inspection surrounded by the broken line illustrated in FIG. 12 may be lengthened.

Figure 13:
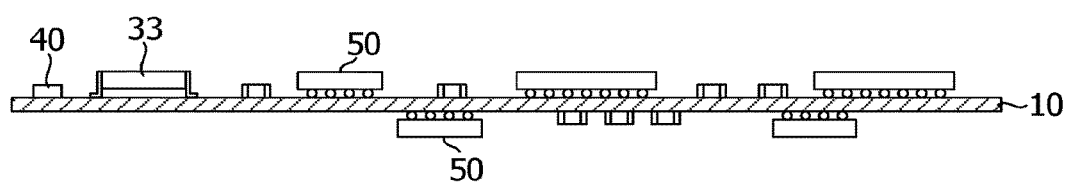
FIG. 13 illustrates an exemplary inspection method.

FIG. 13 illustrates an example of an inspection method. In FIG. 13, an exemplary inspection method for inspecting the conduction state between the vias 13 in the laminated board 10 is illustrated. In the above inspection method, the laminated board 10 is inspected during the reflow process by using the inspection unit 33 mounted on the pallet 20. For example, in the inspection method illustrated in FIG. 13, the laminated board 10 may be inspected by the inspection unit 33 mounted on the laminated board 10 during the reflow process. The inspection unit 33 is coupled to the pad for inspection of the laminated board 10 via the wiring provided on the laminated board 10. For example, when the inspection method illustrated in FIG. 13 is applied, the temperature sensor 40 is also mounted on the laminated board 10.

Supply of electric power for the inspection unit 33 to inspect the laminated board 10 may be performed using the non-contact power supply device 600 (see FIG. 11) provided in, for example, the reflow furnace 400. The operation characteristics of the circuit including the via 13, the wiring 14, and the electronic components 50 may be inspected by the inspection unit 33 mounted on the laminated board 10, and the coupon 500 for inspection as illustrated in FIG. 8 may be chosen as a target to be inspected.

In the inspection method illustrated in FIG. 13, since the inspection of the laminated board 10 is performed during the reflow process as in the inspection method illustrated in FIG. 2 to FIG. 12, expensive inspection equipment including a heating mechanism may be unnecessary. Therefore, a disconnection between the vias 13 in the laminated board may be detected at a lower cost. For example, since the inspection unit 33 is provided on the laminated board 10, the pad for inspection of the laminated board 10 and the inspection unit 33 are coupled using the wiring of the laminated board 10, and the inspection pin may be unnecessary.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. A method for inspecting a laminated board, comprising:
   performing a reflow process to solder an electronic component to a surface of a laminated board in which at least one of a plurality of wiring layers which are laminated with each other is coupled to another adjacent wiring layer via a via; and
   performing, in the reflow process, operations of
      detecting whether a temperature of the laminated board reaches a melting point of a solder,
      detecting whether the temperature of the laminated board is within a temperature range lower than the melting point and higher than room temperature due to lowering of the temperature of the laminated board after detecting that the temperature of the laminated board reaches the melting point of the solder, and
      inspecting a conduction state of the via when detecting that the temperature of the laminated board is within the temperature range, wherein
      the detecting whether the temperature of the laminated board is within the temperature range is performed by monitoring, in the reflow process, ambient temperature of the laminated board and the inspecting of the conduction state of the via is started when the ambient temperature reaches a temperature lower than the melting point of the solder.

2. The method according to claim 1, wherein the conduction state of the via is inspected by inspecting an operation characteristic of a circuit including the via and the electronic component.

3. The method according to claim 1, further comprising:
   forming a daisy chain including a plurality of inspection vias that simulate the via over the laminated board; and
   estimating the conduction state of the via by inspecting the daisy chain.

4. The method according to claim 1, wherein the reflow process is performed by moving the laminated board in a reflow furnace that is configured by coupling a plurality of heating units such that a temperature profile is formed, and the inspecting the conduction state of the via is started when the laminated board passes through a position of the reflow furnace.

5. The method according to claim 1, wherein the conduction state of the via is inspected by performing the reflow process in a state in which the laminated board is mounted on a pallet including an inspection module that includes an inspection pin configured to come into contact with an inspection pad provided on the laminated board and a processor configured to execute an inspection program for inspecting the conduction state of the via, and a plurality of support pins that support the laminated board.

6. The method according to claim 1, wherein the conduction state of the via is inspected by executing an inspection program for inspecting the conduction state of the via by a processor that is mounted on a surface of the laminated board.

7. An inspection module comprising:
   an inspection pin that comes into contact with an inspection pad provided over a laminated board in which at least one of a plurality of wiring layers which are laminated with each other is coupled to another adjacent wiring layer via a via;
   a processor that executes an inspection program for inspecting a conduction state of the via;
   a heat insulating member that surrounds the processor; and
   a temperature sensor that detects an ambient temperature,
   wherein the processor performs, based on the inspection program, operations of:
      detecting whether a temperature of the laminated board reaches a melting point of a solder in a reflow process to solder an electronic component to a surface of the laminated board;
      detecting whether the temperature of the laminated board is within a temperature range lower than the melting point and higher than room temperature due to lowering of the temperature of the laminated board after detecting that the temperature of the laminated board reaches the melting point of the solder; and
      inspecting a conduction state of the via when detecting that the temperature of the laminated board is within the temperature range, wherein
      the detecting whether the temperature of the laminated board is within the temperature range is performed by monitoring, in the reflow process, ambient temperature of the laminated board and the inspecting of the conduction state of the via is started when the ambient temperature reaches a temperature lower than the melting point of the solder.

8. The inspection module according to claim 7, further comprising:
   a receiver that receives a signal transmitted from an outside, wherein the processor starts execution of the inspection program when the signal is received by the receiver.

9. The inspection module according to claim 7, further comprising:
   a battery surrounded by the heat insulating member, wherein the processor is operated by power supplied from the battery.

10. The inspection module according to claim 7, wherein the processor is operated by the power supplied by a non-contact power supply method.

11. A pallet comprising:
    an inspection module that includes an inspection pin configured to come into contact with an inspection pad provided over a laminated board in which at least one of a plurality of wiring layers which are laminated with each other is coupled to another adjacent wiring layer via a via;
    a processor configured to execute an inspection program for inspecting a conduction state of the via;
    a heat insulating member that surrounds the processor, and a temperature sensor that detects an ambient temperature; and
    a plurality of support pins that support the laminated board,
    wherein the processor performs, based on the inspection program, operations of:
    detecting whether a temperature of the laminated board reaches a melting point of a solder in a reflow process to solder an electronic component to a surface of the laminated board;
       detecting whether the temperature of the laminated board is within a temperature range lower than the melting point and higher than room temperature due to lowering of the temperature of the laminated board after detecting that the temperature of the laminated board reaches the melting point of the solder; and inspecting a conduction state of the via when detecting that the temperature of the laminated board is within the temperature range, wherein the detecting whether the temperature of the laminated board is within the temperature range is performed by monitoring, in the reflow process, ambient temperature of the laminated board and the inspecting of the conduction state of the via is started when the ambient temperature reaches a temperature lower than the melting point of the solder.

12. The pallet according to claim 11, further comprising:

a pad for power source that comes in contact with a power source line, wherein the processor is operated by power supplied via the pad for power source.

* * * * *